United States Patent
Kim

(10) Patent No.: US 8,400,766 B2
(45) Date of Patent: Mar. 19, 2013

(54) DUST ELIMINATOR FOR COMPUTER AND CONTROL METHOD THEREOF

(75) Inventor: Ye-Yong Kim, Suwon-si (KR)

(73) Assignee: LG Electronics Inc., Seoul (KR)

( * ) Notice: Subject to any disclaimer, the term of this patent is extended or adjusted under 35 U.S.C. 154(b) by 851 days.

(21) Appl. No.: 12/240,941

(22) Filed: Sep. 29, 2008

(65) Prior Publication Data

US 2009/0272404 A1    Nov. 5, 2009

(30) Foreign Application Priority Data

May 2, 2008   (KR) .................. 10-2008-0041492

(51) Int. Cl.
*H05K 7/20* (2006.01)
(52) U.S. Cl. .................. 361/679.47; 361/697; 361/690; 361/694; 361/695; 361/700
(58) Field of Classification Search .................. None
See application file for complete search history.

(56) References Cited

U.S. PATENT DOCUMENTS

| | | | | |
|---|---|---|---|---|
| 6,100,654 | A * | 8/2000 | Izukawa et al. | 318/114 |
| 6,544,309 | B1 * | 4/2003 | Hoefer et al. | 55/283 |
| 7,161,315 | B2 * | 1/2007 | Hsu | 318/280 |
| 2006/0039113 | A1 | 2/2006 | Cheng et al. | |
| 2007/0058346 | A1 * | 3/2007 | Yeh | 361/697 |
| 2007/0131383 | A1 * | 6/2007 | Hattori et al. | 165/11.2 |
| 2007/0207721 | A1 | 9/2007 | Chang | |
| 2008/0121373 | A1 * | 5/2008 | Wang et al. | 165/84 |
| 2008/0121374 | A1 * | 5/2008 | Wang et al. | 165/95 |

FOREIGN PATENT DOCUMENTS

| | | |
|---|---|---|
| EP | 1 531 384 A2 | 5/2005 |
| EP | 1 798 629 A2 | 6/2007 |
| JP | 2004-219852 A | 8/2004 |
| JP | 2006-332377 A | 12/2006 |
| WO | WO-2005/094151 A | 10/2005 |

* cited by examiner

*Primary Examiner* — Boris Chervinsky
(74) *Attorney, Agent, or Firm* — Birch, Stewart, Kolasch & Birch, LLP

(57) ABSTRACT

The present invention relates to a device for eliminating dust for a computer and a control method thereof. A control unit and a heat-radiating fan controlled by the control unit are provided in the main body. In addition, there is provided a cooling fin through which air stream formed by the heat-radiating fan passes. While the air stream formed by the heat-radiating fan passes through the cooling fan, heat is exchanged between the air stream and the cooling fin and the air stream is then exhausted to the outside of the main body. A vibration-generating element for generating vibration supplied with power is provided at one side of the cooling fin. The control unit controls the driving of the vibration-generating element. Vibration of the vibration-generating element is transmitted to the cooling fin to shake off dust accumulated on the cooling fin. Then, the air stream formed by the heat-radiating fan is exhausted to the outside of the main body together with the dust. Further, the driving of the vibration-generating element cooperates with the driving of the heat-radiating fan. According to the present invention so configured, the dust accumulated on the cooling fin is automatically eliminated by the vibration-generating element, whereby a cooling efficiency is enhanced and convenience in use is increased.

14 Claims, 3 Drawing Sheets

DUST ELIMINATOR FOR COMPUTER AND CONTROL METHOD THEREOF

CROSS REFERENCE TO RELATED APPLICATIONS

The present application is related to, and claims priority to, Korean patent application 10-2008-0041492, filed on May 2, 2008, the entire contents of which are hereby incorporated by reference.

BACKGROUND OF THE INVENTION

1. Field of the Invention

The present invention relates to a computer, and more particularly, to a dust eliminator for eliminating dust and foreign substance adhering to a cooling fin, and a control method thereof.

2. Description of the Related Art

FIG. 1 is a perspective view showing an external appearance of a general computer, and FIG. 2 is a plan view showing the internal configuration of the computer. As shown in the figures, a computer 1 generally comprises a main body 3 and a display unit 5. In general, the display unit 5 is provided with a display screen 6 having a liquid crystal panel, and is connected to a rear portion of the main body 3 to be brought into contact with an upper surface of the man body 3 or unfolded with respect thereto. Like the main body 3, the display unit 5 is formed in the shape of a generally flat hexahedral plate.

The main body 3 is in the shape of a generally flat hexahedral plate, a key board section 7 is provided on the upper surface of the main body. A ventilating hole 9 is formed on one side of an outer surface of the main body 3 to exhaust heat generated in the main body to the outside. Air stream containing heat generated in the main body 3 passes through the ventilating hole 3.

As shown in FIG. 2, a main board 10 is installed in the main body 3. A plurality of heat-generating elements 11 are mounted on the main board 10. The heat-generating elements 11 include, for example, a microprocessor, a chipset, a graphic chip and the like.

In the meantime, a heat-radiating fan 20 is provided in the main body 3 to exhaust heat generated from the heat-generating components 11 to the outside. The heat-radiating fan 20 serves to form air stream directed toward the ventilating hole 9 in the main body 3.

A cooling fin 23 is provided between the ventilating hole 9 and the heat-radiating fan 20. A plurality of fin gaps through which air stream can pass are formed on the cooling fin 23. One ends of heat pipes 25 are in thermal contact with an upper surface of the cooling fin 23. The other ends of the hat pipes 25 are in thermal contact with the heat-generating components 11. The heat pipes 25 serve to transfer heat of the heat-generating components 11 to the cooling fin 23.

A process of cooling the computer constructed as described above will be described. Air stream to be exhausted to the outside via the ventilating hole 9 is formed by the driving of the heat-radiating fan 20. At this time, the air stream, which contains the heat transferred from the cooling fin 23 to the air stream while the air stream passes through the cooling fin 23, is exhausted to the outside.

However, the above related art has the following problems.

Due to the driving of the heat-radiating fan 20, fine dust and foreign substance are accumulated in the gaps of the cooling fin 23 that is passages of the air stream. In particular, the gaps of the cooling fin 23 are clogged with the fine dust accumulated for a long time, so that the air stream formed by the heat-radiating fan 20 cannot pass through the gaps. Consequently, it is impossible to radiate the heat generated in the computer.

In order to solve the problem, a filter is installed at a location adjacent to the cooling fin 23 for filtering dust. However, there is inconvenience in that a user should replace or wash the filter used.

SUMMARY OF THE INVENTION

The present invention is conceived to solve the aforementioned problems in a related art. An object of the present invention is to automatically eliminate dust accumulated on a cooling fine of a computer to keep the cooling fin clean.

Another object of the present invention is to easily clean a cooling fin of a computer.

According to an aspect of the present invention for achieving the objects, there is provided a dust eliminator for a computer, which comprises a main body having an internal space and a ventilating hole; a heat-radiating fan provided in the internal space of the main body to form an air stream for exhausting heat in the main body to the outside; a cooling fin provided between the ventilating hole and the heat-radiating fan, the cooling fin exchanging heat with the air stream passing therethrough; and a vibration-generating element transmitting vibration to the cooling fin to shake off dust accumulated on the cooing fin.

The dust eliminator may further comprise a power supplying unit for supplying the main body with power; and a switch for selectively supplying power from the power supplying unit to the vibration-generating element according to a signal of the control unit, wherein a driving duration of the vibration-generating element and the number of times the vibration-generating element is driven are controlled by the control unit.

The switch is configured to be operated by a user, whereby the user can drive the vibration-generating element if necessary.

The vibration-generating element is a piezoelectric element provided at one side of the cooling fin.

According to another aspect of the present invention, there is provided a method of controlling a dust eliminator, which comprises shaking off dust accumulated on a cooling fin by transmitting vibration to the cooling fin caused by a vibration-generating element provided at one side of the cooling fin; and forming an air stream with a heat-radiating fan provided in a main body; performing heat exchange between the air stream and the cooling fin while the air stream passes through the cooling fin; and exhausting the air stream to the outside of the main body along with the dust separated from the cooling fin, wherein driving of the vibration-generating element cooperates with the driving of the heat-radiating fan.

The vibration-generating element may be driven for a predetermined time from an initial time at which the main body is required to be powered on.

The vibration-generating element may be driven for a predetermined time from an initial time at which the main body is required to be powered off.

The vibration-generating element may be driven for a predetermined time whenever the main body is required to be powered on and powered off.

Rotating a blade provided in the heat-radiating fan at the blade's highest rotating speed while the vibration-generating element is driven.

Varying a speed of a rotating blade provided in the heat-radiating fan while the vibration-generating element is driven.

A dust eliminator for a computer and a control method thereof according to the present invention as described above in detail can obtain the following effects.

In the present invention, vibration of the vibration-generating element attached to the cooling fin causes dust accumulated on the cooling fin to be shaken off, and the dust separated from the cooling fin is then exhausted out of the main body along with air stream formed by the heat-radiating fan. Also, the driving of the vibration-generating element is controlled by the control unit of the main body. Accordingly, there are advantageous effects in that the cooling fin is always kept clean and heat exchange is well performed by the cooling fin to thereby enhance the cooling efficient of the main body.

Further, in the present invention, there is no need to disassemble the main body or separate the cooling fin from the main body for cleaning the cooling fin. Therefore, the cooling fin is easily cleaned to thereby increase the convenience in use.

DESCRIPTION OF THE PREFERRED EMBODIMENT

Hereinafter, a preferred embodiment of a dust eliminator for a computer and a control method thereof according to the present invention will be described in more detail with reference to the accompanying drawings.

Figure 1:
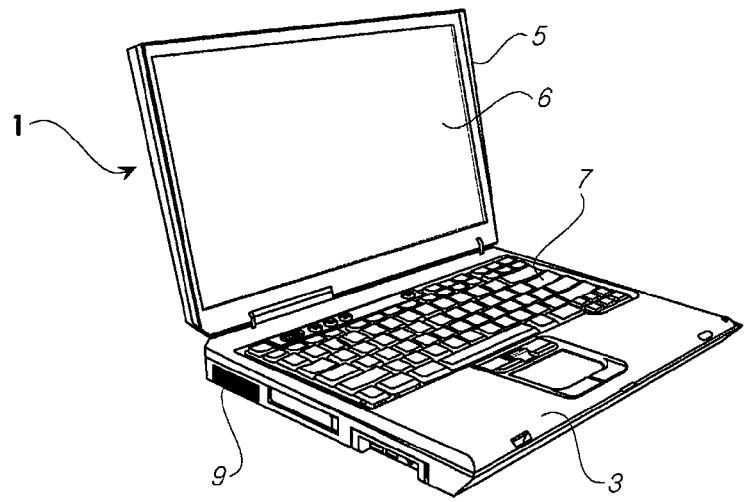
FIG. 1 is a perspective view showing an external appearance of a general computer.
Figure 2:
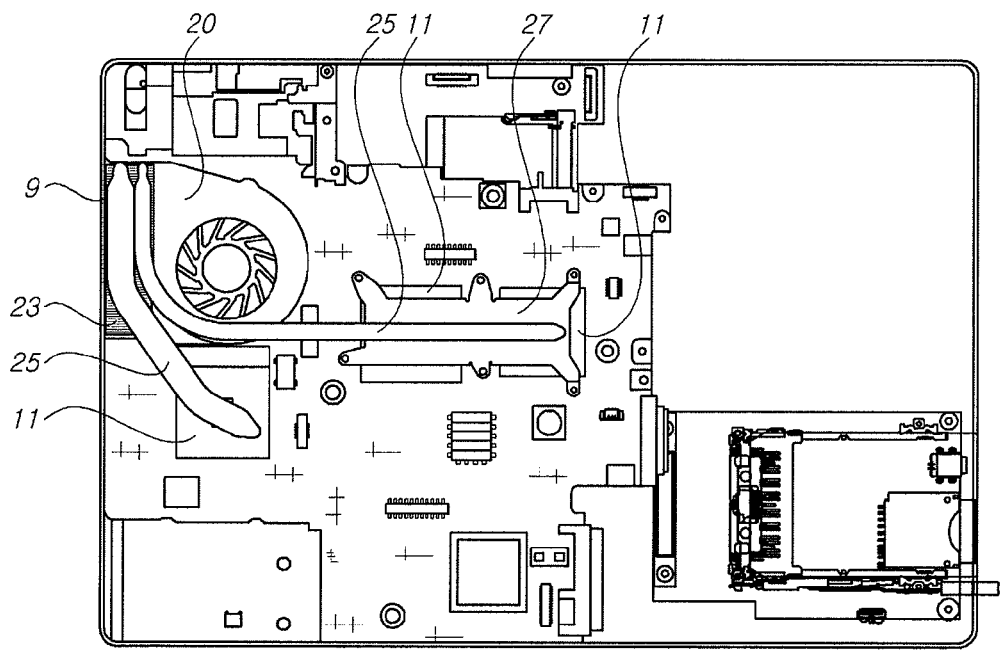
FIG. 2 is a plan view showing the internal configuration of the general computer.
Figure 3:
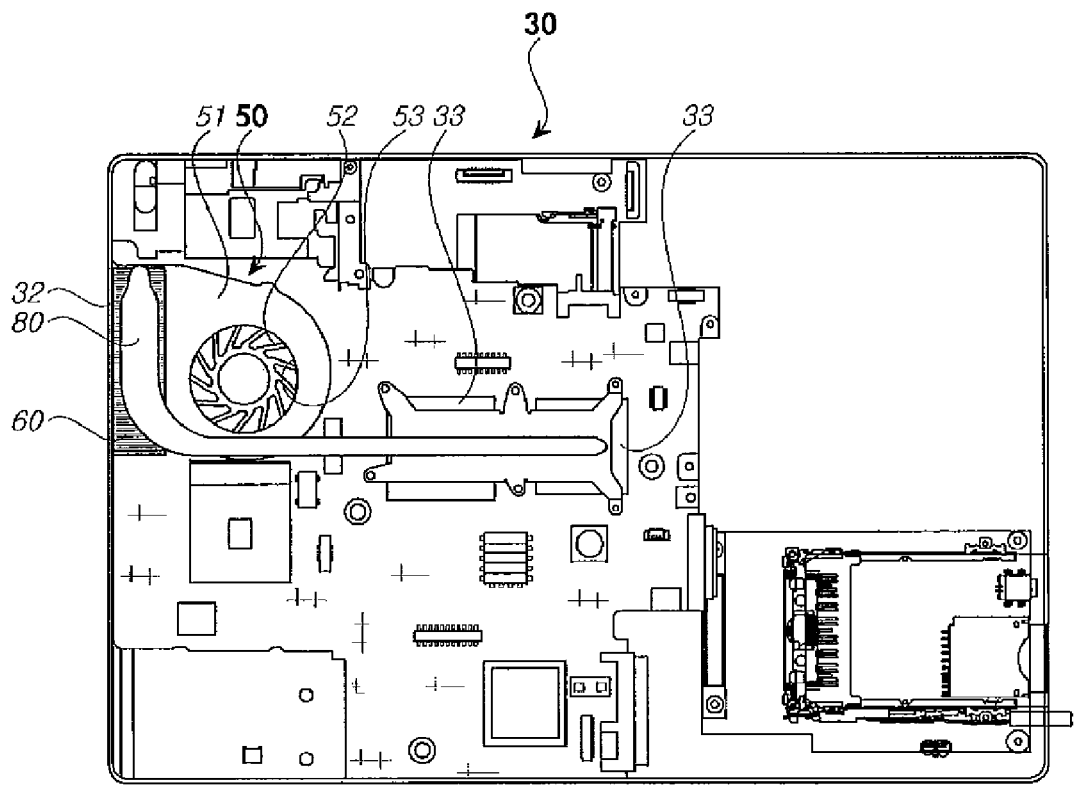
FIG. 3 is a plan view showing the internal configuration of a computer according to the present invention.
Figure 4:
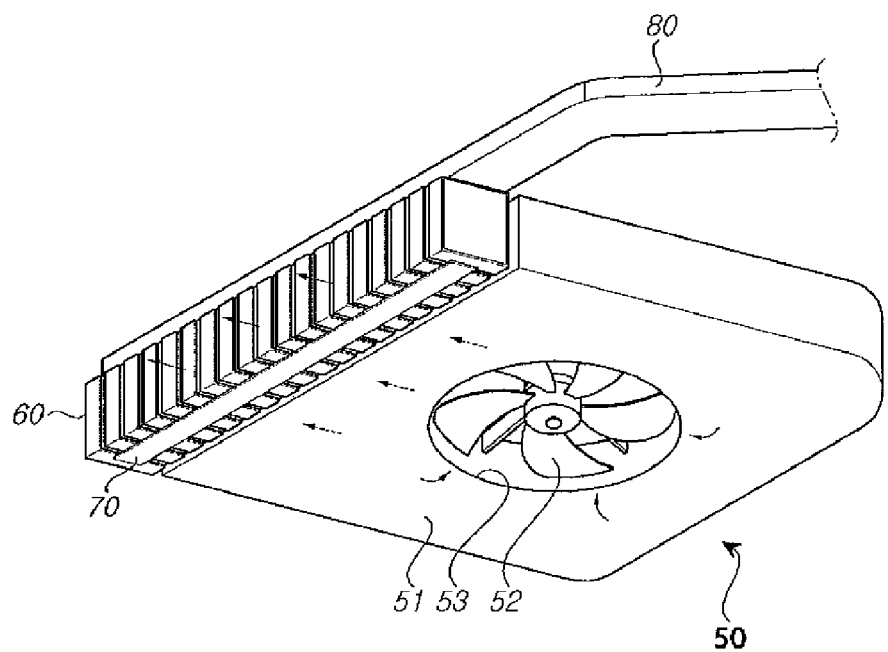
FIG. 4 is a perspective view showing the configuration of a dust eliminator for the computer according to the present invention.
Figure 5:
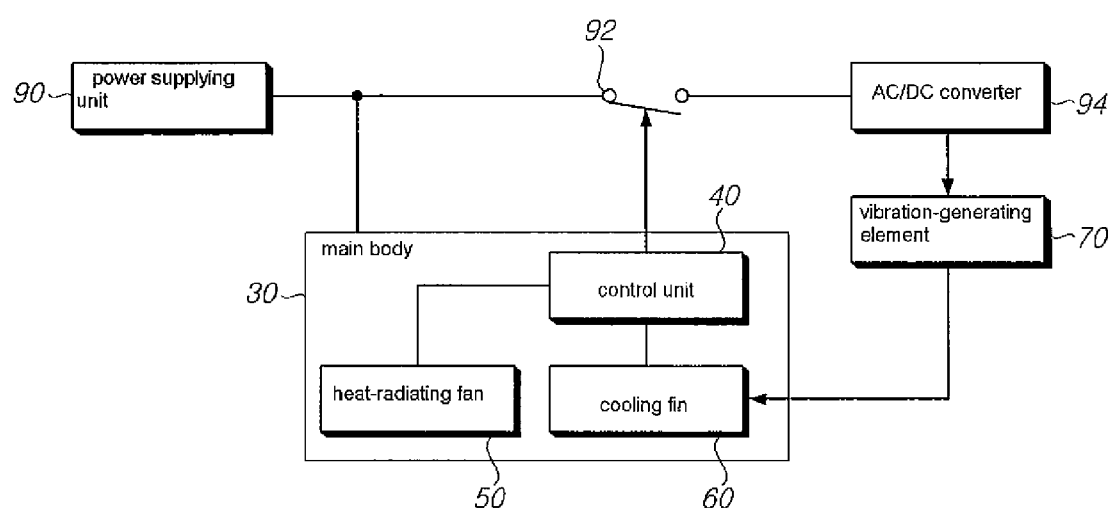
FIG. 5 is a block diagram illustrating the operation of the dust eliminator for the computer according to the present invention.

FIG. 3 is a plan view showing the internal configuration of a computer according to the present invention, FIG. 4 is a perspective view showing the configuration of a dust eliminator for the computer according to the present invention, and FIG. 5 is a block diagram illustrating the operation of the dust eliminator for the computer according to the present invention.

As shown in the figures, a ventilating hole 32 is formed on one side of a main body 30 of the computer. The ventilating hole 32 causes interior and exterior of the main body 30 to communicate with each other. A plurality of heat-generating components 33 are provided inside of the main body 30. The above heat-generating components 33 include a chipset, a control unit 40 to be described below, and the like.

The control unit 40 is provided in the main body 30. The control unit 40 is also called as a central processing unit (CPU).

The control unit 40 processes all kinds of signals to control various components of the main body 30. For example, the control unit 40 controls driving of a heat-radiating fan 50, which will be described later. The control unit 40 detects a temperature in the main body 30, or detects the active operation of the main body 30, to thereby drive the heat-radiating fan 50. It will be apparent that the control unit 40 can periodically drive the heat-radiating fan 50.

In this embodiment, the control unit 40 serves to control driving of a vibration-generating element 70 to be described later. This will be illustrated in more detail later.

In the meantime, the heat-radiating fan 50 is provided at a location adjacent to the ventilating hole 32. The heat-radiating fan 50 serves to form a certain air stream inside of the main body 30. To this end, the heat-radiating fan 50 comprises a fan housing 51 and rotating blades 52, wherein a suction hole 53 is formed on one surface of the fan housing 51. Although not shown, a discharging hole (not shown) is formed on a side surface of the fan housing 51, that is, on a portion opposite to the ventilating hole 32, so that air sucked through the suction hole 53 is exhausted through the discharging hole by rotation of the rotating blades 52.

A cooling fin 60 is provided between the ventilating hole 32 and the heat-radiating fan 50. The cooling fin 60 is configured such that air can pass through the cooling fin. In other words, a plurality of micro gaps are formed in the cooling fin 60. The cooling fin 60 is placed between the discharging hole of the fan housing 51 and the ventilating hole 32, thereby allowing heat-exchange to be performed while air discharged from the discharging hole flows to the ventilating hole 32.

In addition, the vibration-generating element 70 is provided at one side of the cooling fin 60. The vibration-generating element 70 serves to transmit vibration to the cooling fin 60 to thereby shake off fine dusts accumulated on the cooling fin 60. The vibration-generating element 70 includes a piezoelectric element, a vibration motor and the like. The piezoelectric element is changed in shape according to an electrical signal to generate vibration when electric power is applied to the piezoelectric element. Also, the vibration motor is a motor for converting an electrical energy into a mechanical vibration energy using a principle of generating electromagnetic force.

In this embodiment, the vibration-generating element 70 is attached to a lower surface of the cooling fin 60. More specifically, the vibration-generating element 70 is attached to the surface of the cooling fin 60 that is opposite to a surface thereof contacting with a heat pipe 80 to be described later. However, since the vibration-generating element 70 sufficiently functions in it can transmit vibration to the cooling fin 60, there is no necessarily need to attach the vibration-generating element to the lower surface of the cooling fin 60. It is only preferable that the vibration-generating element 70 be provided at a position such that the gaps through which air stream can pass are not blocked and an interference with the heat pipe 80 is not generated.

The heat pipe 80 serves to transfer heat generated in the heat-generating components 33 to the cooling fin 60. To this end, both ends of the heat pipe 80 are in thermal contact with the heat-generating components 33 and the cooling fin 60, respectively, In the meantime, a power supplying unit 90 serves to supply power to the main body 30. In addition, a switch 92 is provided between the power supplying unit 90 and the vibration-generating element 70, and the switch 92 is operated according to the signal of the control unit 40. That is, the switch 92 is operated according to the signal of the control unit 40 and thus the power of the power supplying unit 90 is selectively transmitted to the vibration-generating element 70, so that the driving of the vibration-generating element 70 is controlled.

The information for determining the number of times the vibration-generating member 70 is driven, a driving timing of the vibration-generating member 70, or a duration for each driving of the vibration-generating member 70 may be inputted into the control unit 40 in advance. In this embodiment, for example, the information is stored in the control unit 40 so that the vibration-generating element 70 can be driven for a certain time from an initial time at which electric power is supplied to the main body 30. However, the present invention is not necessarily limited thereto, but the vibration-generating element 70 may be driven several times periodically at regular intervals, may be driven in cooperation with the driving of the heat-radiating fan 50 and may be operated according to the temperature of the heat-generating components 33.

In addition, a user can operate the switch 92 manually. That is, in order to eliminate dust on the cooling fin 60, the user can operate the switch 92 to drive the vibration-generating element 70, if necessary.

In addition, when the user finishes using the computer and then turns-off it, it is possible to shake off dust accumulated on the cooling fin 60. For example, when the supply of power to the main body 30 is interrupted, the vibration-generating element 70 is driven by residual power in the main body 30 to transmit vibration to the cooling fin 60. This is to minimize vibration transmitted to the cooling fin 60 while the user substantially operates the computer, thereby not preventing the user from using the computer.

An AC/DC converter 94 serves to convert the power supplied from the power supplying unit 90 into power suitable for the vibration-generating element 70.

Hereinafter, a function of the dust eliminator for a computer according to this embodiment having the structure as described above will be illustrated in detail. In FIG. 4, air stream in this embodiment is indicated by arrows.

In order to radiate the heat generated in a process of operating the computer the heat-radiating fan 50 is driven. Air sucked through the suction hole 53 by the driving of the heat-radiating fan 50 passes through the cooling fin 60 and then exhausted to the outside through the ventilating hole 32a, wherein while the air passes through the cooling fin 60, heat is exchanged therebetween.

In the meantime, the heat generated in the heat-generating components 33 is transferred to the cooling fin 60 through the heat pipe 80. Then, the cooling fin 60, whose temperature has been raised by the heat pipe 80, is cooled through a heat transferring process between the cooling fin 60 and the air passing therethrough.

At this time, the cooling fin 60 is covered with foreign substance or dust contained in the air passing through the cooling fin 60. If the dust is accumulated on the cooling fin 60, the air stream generated by the heat-radiating fan 50 cannot smoothly pass through the cooling fin 60, so that the heat exchange does not occur sufficiently. In this embodiment, the vibration-generating element 70 attached to the lower surface of the cooling fin 60 vibrates the cooling fin 60, thereby causing dust accumulated on the cooling fin 60 to be separated therefrom. Then, the air stream generated by the heat-radiating fan 50 is exhausted to the outside together with the dust separated from the cooling fin 50.

The driving of the vibration-generating element 70 is controlled by the control unit 40. More specifically, the control unit 40 operates the switch 92, so that the power supplied from the power supplying unit 90 to the vibration-generating element 70 is adjusted to thereby control the driving of the vibration-generating element 70. In addition, the driving of the vibration-generating element 70 may be in cooperation with the driving of the heat-radiating fan 50.

Hereinafter, various embodiments of the method of controlling the dust eliminator will be described.

First Embodiment

The information for operating the switch 92 is stored in the control unit 40 in advance. Preferably, the vibration-generating element 70 is driven for a certain time when the main body 30 is required to be powered on or the main body 30 is required to be powered off. Of course, it will be apparent that the vibration-generating element 70 can be driven for a certain time whenever the main body 30 is required to be powered on and powered off.

This is to shake off dust of the cooling fin 60 before the heat-radiating fan 50 is driven. Also, this is to prevent the vibration from being transmitted to the main body 30 when a user utilizes the main body 30.

According to this embodiment having the aforementioned configuration, when the main body 30 is turned on and off, the dust is separated from the cooling fin 60 by the vibration of the vibration-generating element 70. In addition, the air stream formed by the heat-radiating fan 50 driven during the operation of the main body 30 is exhausted to the outside through the ventilating hole 32 together with the dust separated from the cooling fin 60. As a result, dust accumulated on the cooling fin 60 is not remained in the main body 30, but exhausted to the outside.

At this time, the rotating blades 52 provided in the heat-radiating fan 50 are rotated at the highest rotating speed while the vibration-generating element 70 is supplied with power. This is to eliminate the dust, which is separated from the cooling fin 60 by the vibration of the vibration-generating element 70, by stronger air stream.

In addition, a rotating speed of the rotating blades 52 provided in the heat-radiating fan 50 may be varied while the vibration-generating element 70 is supplied with power. This is to eliminate the dust, which is separated from the cooling fin 60, by air stream with a varied strength.

According to this embodiment, since dust of the cooling fin 60 is eliminated by the vibration-generating element 70, there is no need to clean the cooling fin 60. In addition, there is no need to disassemble the main body 30 or to separate the cooling fin 60 from the main body 30 for cleaning the cooling fin 60.

Second Embodiment

When the driving of the vibration-generating element 70 caused by an instruction of the control unit 40 is insufficient, the user may operate directly the switch 92 to drive the vibration-generating element 70. The switch 92 may be operated by pushing a function key provided on a key board (not shown) that is a separate input device.

Third Embodiment

The vibration-generating element 70 is supplied with power for a certain time when the detected temperature of the heat-generating element 33 provided in the main body 30, particularly, the detected temperature of the CPU according to use of the CPU exceeds the allowable temperature. Allowable temperature ranges of the CPU according to use of the CPU are listed at the following table. Referring to the table, since an allowable temperature range of the CPU is 30~50° C. when the use of the CPU is 20%, the vibration-generating element 70 is supplied with power while the detected temperature exceeds 50° C.

TABLE 1

Allowable temperature range of CPU according to use of CPU

| Use of CPU (%) | Allowable temperature range of CPU (° C.) |
| --- | --- |
| 0~20% | 30~50° C. |
| 20~50% | 40~65° C. |
| 50~90% | 55~75° C. |
| 90~100% | 65~85° C. |

Fourth Embodiment

The vibration-generating element 70 is periodically supplied with power. That is, the vibration-generating element 70 may be supplied with power once a week or once a month.

Fifth Embodiment

A rotating speed of the rotating blades 52 provided in the heat-radiating fan 50 is detected, and then, the vibration-generating element 70 is supplied with power for a certain time when the rotating speed of the rotating blades is a maximum value.

The scope of the present invention is not limited to the embodiment described above but is defined by the appended claims. It will be apparent that those skilled in the art can make various modifications and changes thereto within the scope of the invention defined by the claims.

For example, the dust eliminator of the present invention can be applied to all kinds of electronic appliances provided with a cooling fin and requiring elimination of dust accumulated on the cooling fin as well as the computer.

Also, the dust eliminator of the present invention can be applied for eliminating dust accumulated on micro components requiring elimination of dust in addition to the cooling fin.

What is claimed is:

1. A dust eliminator for a computer, comprising:
a main body having an internal space and a ventilating hole;
a heat-radiating fan provided in the internal space of the main body to form an air stream for exhausting heat in the main body to the outside;
a cooling fin provided between the ventilating hole and the heat-radiating fan, the cooling fin exchanging heat with the air stream passing therethrough;
a vibration-generating element transmitting vibration to the cooling fin to shake off dust accumulated on the cooling fin;
a control unit in the main body;
a power supplying unit for supplying the main body with power;
a switch for selectively supplying power from the power supplying unit to the vibration-generating element according to a signal of the control unit; and
a heat pipe contacting a surface of the cooling fin for transferring heat generated in a heat-generating component provided in the main body to the cooling fin,
wherein the vibration-generating element is in contact with a surface of the cooling fin opposite to the surface of the cooling fin contacting the heat pipe,
wherein a driving duration of the vibration-generating element and the number of times the vibration-generating element is driven are controlled by the control unit, and
wherein the vibration-generating element is driven for a predetermined time from an initial time at which the main body is required to be powered off.

2. The dust eliminator as claimed in claim 1, wherein the switch is configured to be operated by a user, whereby the user can drive the vibration-generating element.

3. The dust eliminator as claimed in claim 1, wherein the vibration-generating element is a piezoelectric element provided at one side of the cooling fin.

4. The dust eliminator as claimed in claim 1, further comprising rotating blades provided in the heat-radiating fan, wherein the rotating speed of the rotating blades is varied while the vibration-generating element is supplied with power.

5. A method of controlling a dust eliminator, comprising:
transferring heat generated in a heat generating component to a cooling fin through a heat pipe;
shaking off dust accumulated on a cooling fin by transmitting vibration to the cooling fin caused by a vibration-generating element provided at one side of the cooling fin;
forming an air stream with a heat-radiating fan provided in a main body;
performing heat exchange between the air stream and the cooling fin while the air stream passes through the cooling fin; and
exhausting the air stream to the outside of the main body along with the dust separated from the cooling fin,
wherein driving of the vibration-generating element cooperates with the driving of the heat-radiating fan, and
wherein the heat pipe contacts a surface of the cooling fin and the vibration-generating element is in contact with a surface of the cooling fin opposite to the surface of the cooling fin contacting the heat pipe.

6. The method as claimed in claim 5, wherein the vibration-generating element is driven for a predetermined time from an initial time at which the main body is required to be powered on.

7. The method as claimed in claim 5, wherein the vibration-generating element is driven for a predetermined time from an initial time at which the main body is required to be powered off.

8. The method as claimed in claim 5, wherein the vibration-generating element is driven for a predetermined time whenever the main body is required to be powered on and powered off.

9. The method as claimed in claim 5, further comprising rotating a blade provided in the heat-radiating fan at the blade's highest rotating speed while the vibration-generating element is driven.

10. The method as claimed in claim 5, further comprising varying a speed of a rotating blade provided in the heat-radiating fan while the vibration-generating element is driven.

11. The method as claimed in claim 5, further comprising driving the vibration-generating element for a predetermined time when the temperature of a heat-generating element provided at one side of the main body is detected and exceeds an allowable temperature.

12. The method as claimed in claim 5, further comprising periodically driving the vibration-generating element.

13. The method as claimed in claim 5, further comprising driving the vibration-generating element for a predetermined time when a rotating blade provided in the heat-radiating fan is rotated at the blade's highest rotating speed.

14. The method as claimed in claim 5, further comprising controlling the driving of the vibration-generating element by a user's operation of a switch.

* * * * *